United States Patent
Cheng et al.

(10) Patent No.: US 9,496,373 B2
(45) Date of Patent: Nov. 15, 2016

(54) DAMAGE-RESISTANT FIN STRUCTURES AND FINFET CMOS

(71) Applicant: International Business Machines Corporation, Armonk, NY (US)

(72) Inventors: Kangguo Cheng, Schenectady, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/677,000

(22) Filed: Apr. 2, 2015

(65) Prior Publication Data

US 2016/0293736 A1     Oct. 6, 2016

(51) Int. Cl.
| | |
|---|---|
| *H01L 29/786* | (2006.01) |
| *H01L 29/78* | (2006.01) |
| *H01L 21/77* | (2006.01) |
| *H01L 29/66* | (2006.01) |
| *H01L 29/161* | (2006.01) |
| *H01L 21/324* | (2006.01) |
| *H01L 21/3105* | (2006.01) |
| *H01L 21/02* | (2006.01) |
| *H01L 29/06* | (2006.01) |

(52) U.S. Cl.
CPC ... *H01L 29/66818* (2013.01); *H01L 21/02164* (2013.01); *H01L 21/02175* (2013.01); *H01L 21/02178* (2013.01); *H01L 21/02181* (2013.01); *H01L 21/02186* (2013.01); *H01L 21/02189* (2013.01); *H01L 21/02192* (2013.01); *H01L 21/02194* (2013.01); *H01L 21/31053* (2013.01); *H01L 21/324* (2013.01); *H01L 29/0649* (2013.01); *H01L 29/161* (2013.01); *H01L 29/66553* (2013.01); *H01L 29/785* (2013.01)

(58) Field of Classification Search
CPC .................. H01L 29/66818; H01L 29/66553; H01L 29/785; H01L 29/0649; H01L 29/161; H01L 21/02186; H01L 21/02178; H01L 21/02192; H01L 21/02715; H01L 21/02164; H01L 21/324
USPC ................. 257/38, 202, 347, 349, 365, 506, 257/E29.117, E29.137, E29.273, E21.409, 257/E21.415, E21.444; 438/149, 221, 284, 438/474
See application file for complete search history.

(56) References Cited

U.S. PATENT DOCUMENTS

| | | | |
|---|---|---|---|
| 7,115,953 B2 | 10/2006 | Shimizu et al. | |
| 7,456,476 B2 * | 11/2008 | Hareland | H01L 29/42384 257/349 |
| 8,318,555 B2 | 11/2012 | Signamarcheix et al. | |

(Continued)

*Primary Examiner* — Dao H Nguyen
(74) *Attorney, Agent, or Firm* — Nicholas D. Bowman

(57) ABSTRACT

A design structure for a semiconductor circuit structure, readable by a machine used in design, manufacture, or simulation of an integrated circuit, involves a fin, a footer, and an inlay. The fin includes a fin perimeter and a fin base with an overhang area. A footer with a first top side, a footer perimeter, and a plurality of footer perimeter sides can be made of an insulator layer also having an open area with a second top side outside the footer perimeter. The footer perimeter is within the fin perimeter, the fin base resting on the first top side with the overhang area being on the fin base between the fin perimeter and the footer perimeter. The design structure further involves an etch-resistant inlay, with an inlay thickness, on the second top side and touching the overhang area and each of the plurality of footer perimeter sides.

9 Claims, 8 Drawing Sheets

(56) References Cited

U.S. PATENT DOCUMENTS

| | | |
|---|---|---|
| 8,501,589 B2 | 8/2013 | Fournel et al. |
| 8,530,287 B2 | 9/2013 | Cai et al. |
| 8,586,426 B2 | 11/2013 | Dennard et al. |
| 8,586,966 B2 * | 11/2013 | Bangsaruntip ......... B82Y 10/00 257/38 |
| 8,697,536 B1 | 4/2014 | Cheng et al. |
| 9,029,213 B2 * | 5/2015 | Chang ............... H01L 29/42392 257/E21.224 |
| 2004/0198003 A1 * | 10/2004 | Yeo ....................... H01L 29/785 438/284 |
| 2005/0280090 A1 * | 12/2005 | Anderson ............. H01L 29/785 257/347 |
| 2011/0012090 A1 | 1/2011 | Singh et al. |
| 2011/0133169 A1 * | 6/2011 | Bangsaruntip ......... B82Y 10/00 257/38 |

\* cited by examiner

FIG. 1
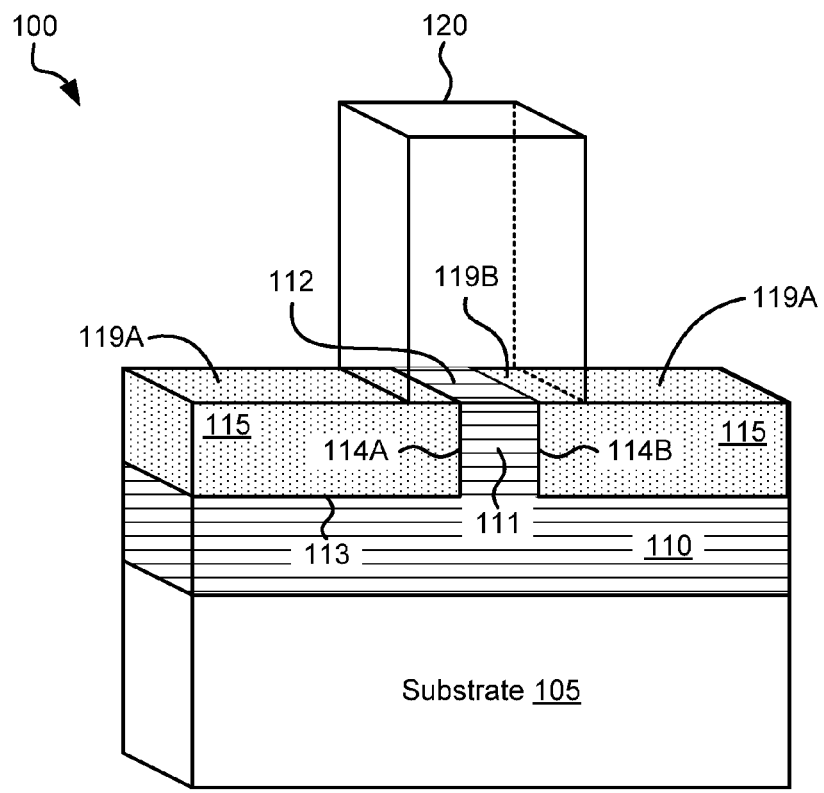
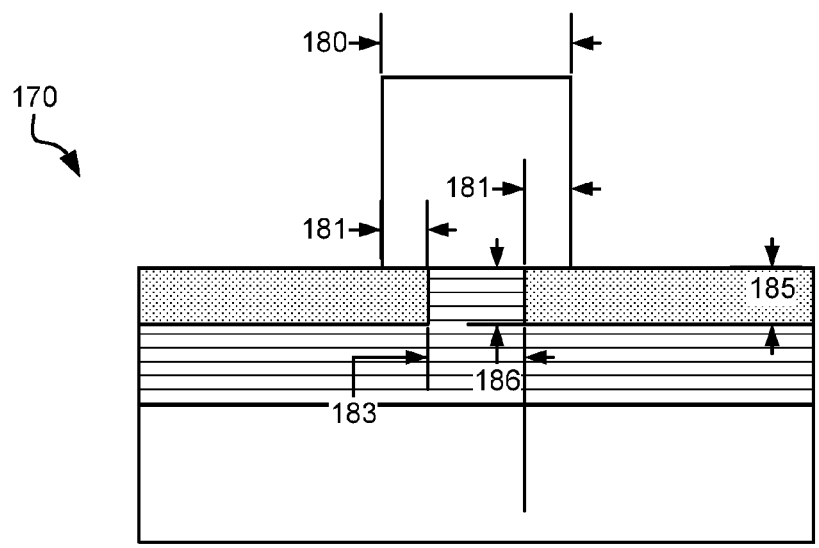

DAMAGE-RESISTANT FIN STRUCTURES AND FINFET CMOS

BACKGROUND

The present disclosure relates to a design structure for a semiconductor device, and more particularly to a design structure for a fin of a fin field effect transistor (FinFET) that may be resistant to undercut, tipping, and liftoff, as well as a method of making such a damage-resistant FinFET structure. During semiconductor circuit manufacturing, some steps may include removing films or residues from a wafer surface.

SUMMARY

Certain embodiments are directed toward a semiconductor structure with a fin, a footer, and an inlay. The fin can have a fin perimeter and a fin base, the fin base having an overhang area; while an insulator layer can have an open area and a footer, the footer having a first top side, a footer height, and a footer perimeter with a plurality of footer perimeter sides, the footer perimeter being within the fin perimeter, the fin base resting on the first top side with the overhang area being on the fin base between the fin perimeter and the footer perimeter, the open area having a second top side outside the footer perimeter. The semiconductor structure can also have an etch-resistant inlay, having an inlay thickness, on the second top side and against the overhang area and each of the plurality of footer perimeter sides.

Various embodiments are directed toward a method of making a damage-resistant fin for a fin field effect transistor (FinFET), comprising: creating a fin with a first fin perimeter and a fin base, the fin base resting on a first top side of an insulator layer, the first top side having an open area outside the first fin perimeter; and recessing the insulator layer, the recessing including a vertical recess to form a second top side, and a horizontal recess to expose an overhang area of the fin base, the vertical recess and the horizontal recess forming a footer having a footer height and a footer perimeter, the footer perimeter having a plurality of footer perimeter sides and being within the first fin perimeter and the second top side being the footer height below the first top side. The method can further comprise creating an inlay on the second top side, the inlay being made from an inlay material and having an inlay thickness similar to the footer height, the inlay being against the overhang area and each of the plurality of footer sides.

Some embodiments relate to a design structure readable by a machine used in design, manufacture, or simulation of an integrated circuit, the design structure comprising a fin, a footer, and an inlay, wherein the fin has a fin perimeter and a fin base, the fin base having an overhang area; and the insulator layer has an open area and a footer, the footer having a first top side, a footer height, and a footer perimeter with a plurality of footer perimeter sides, the footer perimeter being within the fin perimeter, the fin base resting on the first top side with the overhang area being on the fin base between the fin perimeter and the footer perimeter, the open area having a second top side outside the footer perimeter. The design structure may further describe an etch-resistant inlay with an inlay thickness, the etch-resistant inlay resting on the second top side and being in contact with the overhang area and each of the plurality of footer perimeter sides. The above summary is not intended to describe each illustrated embodiment or every implementation of the present disclosure.

BRIEF DESCRIPTION OF THE SEVERAL VIEWS OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 1 depicts cross sections of a damage resistant FinFET resting on a footer made of insulator material, according to embodiments.

Figure 2:
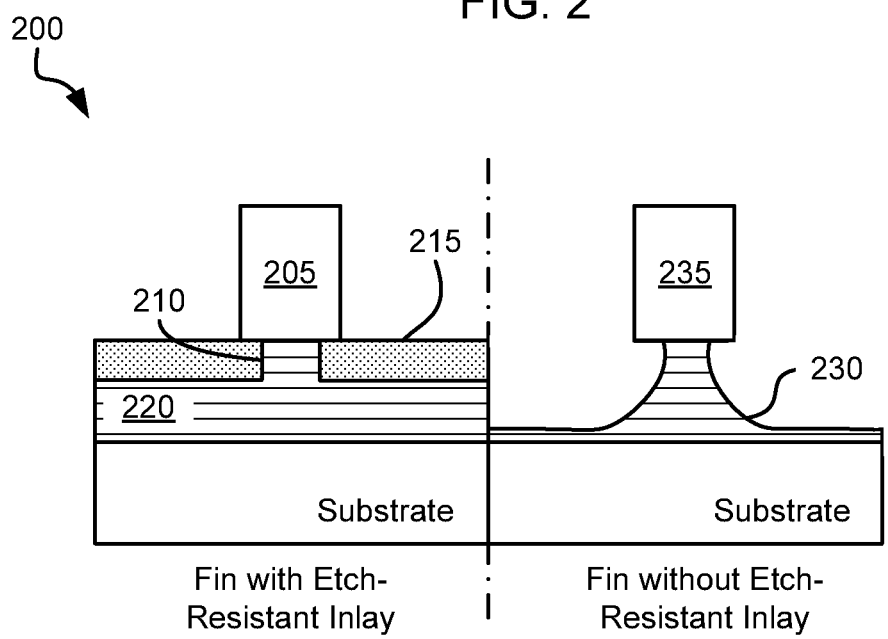
FIG. 2 portrays the squared footer present beneath a fin structure with an adjacent etch-resistant inlay that extends beneath the fin edges, and the curved profile of an unprotected insulator layer supporting a fin structure, according to embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to a design structure for a damage-resistant fin of a fin field effect transistor (FinFET) and to a method for making damage-resistant fin structures. More particular aspects of the present disclosure relate to the design and manufacture of fin structures having an etch-resistant inlay material deposited on top of a recessed insulator layer such that the etch-resistant inlay is in contact with the bottom side or base of a fin and isolates the insulator layer beneath the inlay. Fins for FinFETs can be prepared in large fin arrays that are subsequently cut into active fin segments. Active fin segments can be incorporated into FinFETs by creating source, drain, and gate structures to complete the FinFETs structure. Fin structures may be roughly etched using a first hardmask to define their general shape and size, and then may be subsequently trimmed (adjusting their width and height, according to embodiments), in order to make fins appropriate for incorporation into FinFETs.

For the purposes of discussion herein, the term fin structures can generally refer to long lines of material that have been etched using a hardmask but have not been trimmed (undergone a final height/width adjustment, such as by oxidization of the semiconductor material of the fin structure). Fin structures can generally refer to lines of material that can later become part of a final FinFET structure. The term fin can generally refer to a fin structure before or after a trimming process, and before or after incorporation of the fin in a FinFET.

Fins and fin structures, generally being long and tall, can be prone to damage associated with lateral forces applied to the fin. Etch-resistant inlay may significantly reduce the amount of damage observed in fin arrays during manufacturing processing by reducing the degree to which the insulator layer is etched or undercut by plasma or aqueous etching chemistries. When the insulator layer is severely etched or undercut, fin structures can become more prone to tipping, damage caused by lateral forces, or liftoff (where the insulator layer beneath the fin structure is removed and the fin has little or no insulator layer beneath it).

The etch-resistant inlay can be deposited on top of an insulator layer that can be vertically recessed and horizontally recessed to create a recess volume. The recess volume can include a pocket or undercut beneath each side of a fin structure. The combined vertical and horizontal recessing creates a footer made of the insulator layer material. The footer supports the fin structure while the etch-resistant inlay is deposited into the recess volume. The etch-resistant inlay that fills the recess volume (formerly occupied by some of the insulator layer) prevents plasma or etching chemicals from making contact with the insulator layer. While the present disclosure is not necessarily limited to such applications, various aspects of the disclosure may be appreciated through a discussion of various examples using this context.

FIG. 1 depicts cross sections 100 and 170 of a damage-resistant fin structure 120 resting on a footer 111. Cross section 100 shows a substrate 105 that supports an insulator layer 110. The insulator layer has a first top side 112 on top of footer 111. The insulator layer 110 also has a second top side 113 that is below the first top side 112 and that extends outward from the footer perimeter to form an open area beyond the sides of the fin structure 120. The footer 111 has a plurality of footer perimeter sides 114A and 114B that make contact with an etch-resistant inlay 115 along the entire footer perimeter. The etch-resistant inlay 115 rests on top of the second top side 113, contacts each of the footer perimeter sides 114A and 114B, and also contacts an overhang area 119B on the base of the fin structure 120. Etch-resistant inlay 115 has an inlay top side 119A configured such that the inlay thickness is approximately the same as the footer height. Etch-resistant inlay may be located on the wafer surface in one or more segments.

Cross section 170 shows a structure that is analogous to that shown in cross section 100 that is intended to describe the locations of various thicknesses, widths, and heights associated with the etch-resistant inlay, the insulator layer, the footer, and the fin structure. The fin structure has a fin width 180. In some embodiments, a base width at the base of the fin structure is equal to the sum of three separate measurements. The first measurement is that of a footer width 183 of the footer 111 on which the fin structure 120 rests. The other two measurements are of an overhang width 181, the amount that the fin structure 120 extends past the sides of the footer 111 and rests on the inlay top side 119A. Because the fin structure 120 rests on the inlay 115 on both sides of the fin structure, the overhang width 181 is counted twice, once for the overhang on each side of the footer 111. In some embodiments, a fin structure may have a base width between 6 nanometers (nm) and 20 nanometers from one side to the other side. For embodiments having a base width of 6 nm, the footer beneath the fin may be at least 3 nm wide in order to secure the fin during processing to inlay material, and have an overhand of approximately 1.5 nm on each side of the footer. In embodiment with a base width of 10 nm, the footer may have a footer width of 6 nm with a 2 nm overhang on each side of the footer. The footer width 183 may be, according to some embodiments, as much as fifty percent of the width of the fin structure 120 that it supports. In some embodiments, the size of the overhang beneath the fin structure 120, may be approximately the same as the footer height. In some embodiments, the footer height may be at least four nm. The recess volume may be created by an isotropic etch process (whether plasma-based etching or wet chemical etching) to recess vertically and horizontally at similar rates.

Other measurements associated with the etch-resistant fin structure 120 are the inlay thickness 185 and the footer height 186. In some embodiments, these measurements are approximately the same. Further, in some embodiments, beneath the fin structure 120, under the overhang area 119B of the base of the fin structure, the inlay thickness 185 and the footer height 186 are approximately the same, while in the open area beyond the footer perimeter the inlay thickness may vary somewhat from the footer height.

FIG. 2 shows comparative cross sections 200 of two representative fin structures after processing the wafer surface with plasma or wet etch chemistries that can recess the insulator layer supporting the fin structures. The first fin 205 had received an etch-resistant inlay, and the second fin 235 had not received an etch-resistant inlay, before processing to remove a layer such as a silicon dioxide cap layer or a protective mask layer on top of the fin. In the left cross section, a first fin 205 resting on a footer 210 of an insulator layer 220 may have an etch-resistant inlay 215 that rests on the top of part of the insulator layer 220, and which contacts the sides of the footer 210 and which further contacts the base of the first fin 205 at the overhangs (where the fin extends past the perimeter of the footer 210). The physical contact between the inlay 215 and the first fin 205 isolates the insulator layer 220, preventing it from being damaged by etching or other processing steps that intended to remove a silicon dioxide cap layer from atop a trimmed fin.

A second fin 235 that has not been surrounded by an etch-resistant inlay may rest on an insulator layer 230 during trim processing. Upon removing the silicon dioxide cap layer that forms on a fin during trimming, both the cap layer and the insulator layer 230 can be etched, leading to erosion of the insulator layer beneath the trimmed second fin 235. Pronounced cases of erosion may lead to a trimmed second fin 235 that is severely undercut with a pronounced curve extending away from the fin as the insulator layer profile extends away from the second fin 235. Severe insulator layer erosion can make a trimmed second fin 235 more susceptible to tipping, undercut (where the insulator layer is completely removed beneath some of a fin), and liftoff (where the insulator layer beneath a fin is removed beneath all of a fin).

Figure 3:
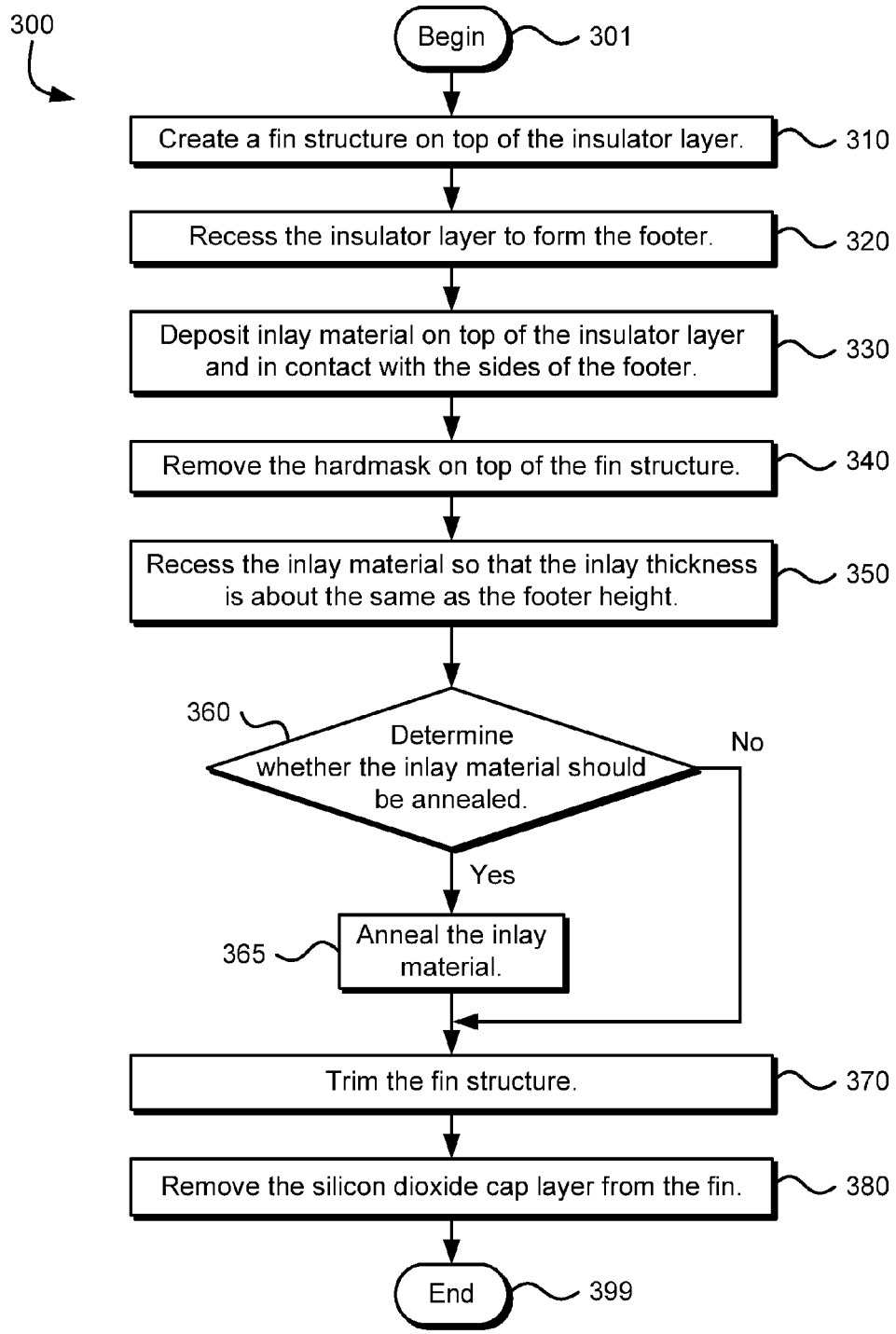
FIG. 3 describes steps of a method of making a damage-resistant fin structure, according to embodiments.

FIG. 3 describes steps of a method 300 of making a damage-resistant fin structure similar to embodiments described in FIG. 1 and FIG. 2, according to embodiments. The method begins in block 301. During the making of a damage resistant fin, a fin can be created from a silicon film (or, in the case of a silicon germanium fin, from a silicon film into which germanium has been diffused (as from a silicon germanium layer deposited on top of the silicon film 415 in FIG. 4)), as described in block 310. The shape of the fin formed from the silicon film, or from the germanium-infused silicon film, determines the shape of the etch-resistant inlay because the fin acts as a mask during the formation of the recess volume adjoining (and slightly beneath) the fin. The fin may also act as a mask during inlay material deposition.

The fins formed by methods consistent with the present disclosure can be incorporated into negatively doped field effect transistors (NFETs) and positively doped field effect transistors (PFETs), including positively and negatively doped FinFETs. Although references to a single type of FinFET may be made at certain locations hereinafter, the techniques and design structures described herein are to be construed to cover formation of inlay beneath and adjoining both silicon fins and silicon germanium FinFETs without regard to dopant concentrations, technology nodes, and the types of FinFETs being created.

During the creation of integrated circuits with both negatively doped field effect transistors and positively doped field effect transistors (NFETs and PFETs) on a single semiconductor wafer, regions of the wafer may be masked to protect films and structures while unmasked regions, or regions with patterned masks, are exposed to a variety of processing conditions. For example, in some embodiments, one region of a wafer may be masked by a continuous film (e.g., a "blanket film" in that area), while other wafers may have no mask. Some embodiments may have continuous mask films in some areas while other areas have patterned films that are being used, e.g., for recessing an insulator or for etching a fin structure out of a continuous material film beneath the patterned film(s) in that region.

Fin structures on a wafer surface may have a first width created by the etch process that first formed the fin structure. However, at some point it may become desirable to adjust the size of the fin structure features in order to, e.g., tune electrical characteristics of the integrated circuit. Trimming a fin structure can be accomplished by exposing a fin structure to an oxygen-containing atmosphere, sometimes at elevated temperatures, in order to form a layer (a cap layer) of silicon dioxide on the exposed surface of the fin. Trimming can be performed on both silicon fin structures and silicon germanium structures.

In some embodiments, in addition to trimming a silicon germanium fin to alter its shape, exposure to heat and oxygen can condense germanium from the outer region of the silicon germanium fin (where the silicon atoms become part of a silicon dioxide cap layer) into the interior portion of the silicon germanium fin. The diffusion of germanium during condensing provides a manufacturer with some further control over the concentration of germanium in a fin, with the further result of affording some control over the strain levels (and the electrical performance) of the fin. Condensing can occur on fin structures, or in "blanket" areas of films without structures or features (see FIG. 4 and FIG. 5) in order to diffuse or concentrate germanium or other dopants, according to manufacturing processes known to practitioners.

Once a fin structure has been created on top of an insulator layer, the insulator layer can be vertically and horizontally recessed in order to form a footer made of insulator material beneath the fin structure, as described in block 320. The size and shape of a footer can depend on the size of the fin structure, the type of material in the insulator layer, the etching chemistries being used, including their concentration, and the time allocated to perform the recess etch to form the footer. The first fin perimeter of the fin structure can reflect the approximate shape of the hardmask used to define the fin structure during the creation of the fin structure. The first fin perimeter may be somewhat larger than a second fin perimeter created after the fin structure is trimmed (using an oxidation process) in order to adjust the fin structure dimensions to make a final fin shape. The first fin perimeter and the second fin perimeter can be larger than the footer perimeter in order to permit an inlay material to fill the recess volume created by recessing the insulator layer.

According to embodiments, the insulator layer can be a silicon dioxide layer from a silicon-on-insulator (SOI) wafer. Although other dielectric insulators can be used, it may be advantageous to use silicon dioxide as the insulator layer because of the lower likelihood of fin tipping or liftoff damage on silicon dioxide insulator layers relative to the likelihood of fin tipping or liftoff for fins on insulator layers made of other dielectric materials. SOI wafers may thus be desirable as starting materials for creation of damage-resistant fin structures because tipping damage or liftoff may be less likely than on other materials and because SOI wafers are generally readily available.

The insulator layer can be recessed using, for example, dilute acids such as dilute hydrofluoric acid, in order to simultaneously perform a vertical recess and a horizontal recess, creating a recess volume in which material can be deposited. The recess volume may extend past the fin perimeter below the fin, creating an overhang that the inlay material can make contact with in order to isolate the insulator material. When the insulator layer is not protected, subsequent exposures to acids or other chemicals may erode the insulator material beneath the fin, leading to increased susceptibility to damage that can manifest as broken or tipped or lifted-off fins following lateral or horizontal stresses. The etch time and concentration of etchant can also influence the size of a recess formed beneath a fin.

As described in block 330, once the insulator material has been recessed in both vertical and horizontal directions, inlay material may be deposited on top of the insulator layer. Examples of inlay material can include high dielectric constant (κ) dielectric materials such as the oxides: $HfO_2$, $ZrO_2$, $La_2O_3$, $Al_2O_3$, $TiO_2$, $SrTiO_3$, $LaAlO_3$, and $Y_2O_3$. In some embodiments, inlay materials may include high-K dielectric materials such as the oxy-nitrides: $HfO_xN_y$, $ZrO_xN_y$, $La_2O_xN_y$, $TiO_xN_y$, $SrTiO_xN_y$, $LaAlO_xN_y$, and $Y_2O_xN_y$. Various embodiments may use a silicate as an etch-resistant inlay material where the silicate includes one or more metals. Metals that can be used for silicate inlay materials can include hafnium, zirconium, lanthanum, aluminum, titanium, strontium, yttrium, and combinations thereof. The inlay material may be deposited both on top of an open area of the insulator material outside the perimeter of the fin, as well as beneath the overhang area of the base of the fin, contacting the overhang area and each of the plurality of sides of the footer perimeter.

According to some embodiments, the inlay material may be deposited so thickly that it covers not only each of the fins in the fin array but any remaining hardmask material on top of the individual fins. Semiconductor wafers with such thick films of inlay material may be planarized to expose any hardmask material on top of the fin structures (whether NFET or PFET structures), and, as described in block 340, the hardmask material may be etched away using selective chemistries (such as phosphoric acid for etching silicon nitride) that can remove the hardmask material while leaving inlay material behind. In embodiments that use a high-K dielectric material such as hafnium dioxide as an inlay material, the hardmask material used to define the shape of the fin during the fin formation etch may be a silicon nitride or a silicon dioxide film. Embodiments that involve silicon nitride as an inlay material may have a bilayer hardmask scheme, where a top mask layer of silicon nitride sits on a bottom mask layer of silicon dioxide (on top of the fin). Silicon dioxide as a bottom mask layer can provide endpoint detection capability during chemical mechanical polishing (planarization) in order to avoid accidental erosion of the fin itself as the inlay material is thinned.

After removal of a patterned mask, inlay materials that are deposited very thickly (e.g., they extend upward past the top of the fin) on top of the semiconductor wafer may be recessed or thinned, as described in block 350, using various chemistries appropriate to the particular inlay material on the insulator layer. The thinning or recessing of inlay material may proceed until the inlay material has an inlay thickness roughly equal to the footer height of the footer formed by the recessing of the insulator layer. The recessing can be performed using either a wet etch process or a plasma-based process. Hafnium dioxide, for example, can be recessed using dilute hydrofluoric acid, whereas yttrium oxide ($Y_2O_3$) can be etched using a plasma containing one or more halogen-containing gasses such as carbon tetrafluoride, boron trichloride, hydrobromic acid, or chlorine. Further methods of recessing (using plasma etching or wet etch processes) inlay materials down to a thickness approximately the same as the footer height can be readily identified and carried out by practitioners using available references.

According to embodiments, silicon dioxide and silicon nitride may be used as films in a bilayer hardmask that can provide some advantages when planarizing wafers following fill material deposition onto the fin structures. Recessing of the inlay material may create a stepped profile in the bilayer hardmask, where one of the films is etched back more than the other film during the recessing. Nevertheless, the use of appropriately selected chemistries to clean a semiconductor wafer surface, to remove hardmask residues, and to thin inlay materials deposited on top of the insulator layer can provide a flexible set of processing conditions to create inlays that surround fin footers and isolate the insulator layer from subsequent etch processing or chemical exposures.

A high-κ dielectric material may have a generally amorphous structure when it is deposited onto a semiconductor wafer, making it more easily etched/recessed than after the high-κ has been annealed upon exposure to sufficient heat. For example, hafnium dioxide may display some resistance to etching chemistries that remove silicon dioxide before it is annealed, making it relatively straightforward to recess the hafnium dioxide inlay material. Once annealed, hafnium dioxide may also provide significant degrees of improved resistance to etch damage during both solvent-based etching and plasma processing of wafer surfaces during subsequent processing steps. Accordingly, the method can include a step wherein one determines whether an inlay material should be annealed, as described in block 360. When no annealing is indicated, one may proceed to trim the fin structure, as described in block 370. However, when annealing is indicated, one may anneal the recessed inlay material as indicated in block 365 before performing the trimming step of block 370.

According to some embodiments, the process of trimming a fin structure may, for silicon germanium fin structures, also include condensing the germanium in the silicon germanium to increase the germanium concentration. The process can further include removing the silicon dioxide cap layer from the FinFET after the trimming process, as described in block 380. The method ends in block 399.

FIGS. 4 through 10 show profiles of film stacks and fins/fin structures formed during the manufacturing steps associated with making silicon FinFETs and silicon germanium FinFETs. Numbering in the series of figures may repeat in order to show consistency of structures through the manufacturing process (i.e., as if a single semiconductor wafer was being processed and examined at different stages of the manufacturing process), but should not be interpreted to limit the disclosure or the scope of the invention described herein. Steps described in the following figures may be performed individually in some embodiments, or in various combinations, with some steps being added to or eliminated from the overall flow, and still result in the overall design structure, process, or semiconductor device envisioned. Further, the precise steps described herein can be performed in various combinations on one or more semiconductor wafers and still result in an embodiment of the invention.

Figure 4:
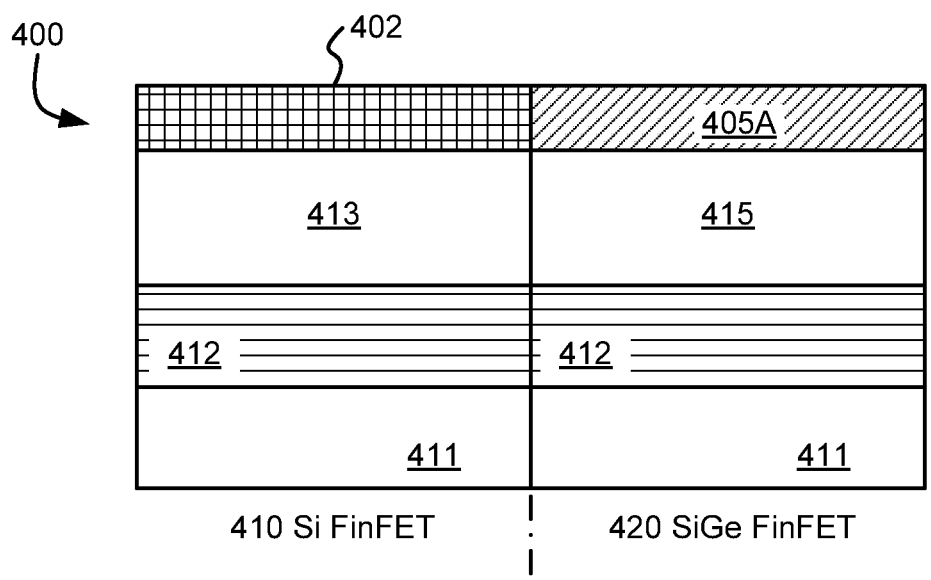
FIG. 4 shows a cross-sectional view of film stacks that can be used to make damage-resistant fin structures, according to embodiments.

FIG. 4 shows a cross-sectional view 400 of films on two different parts of a SOI semiconductor wafer during the process of making a damage-resistant fin structure prior to creating a FinFET, according to embodiments. On the left side of FIG. 4 is a silicon FinFET stack 410 in a first area of a semiconductor wafer. On the right side of FIG. 4 is a silicon germanium FinFET stack 420 in a second area of a semiconductor wafer. For purposes of discussion, these two stacks will be treated herein as being on the same wafer, and the process described in the formation a fin of a silicon FinFET and a fin of a silicon germanium FinFET in the two regions will be a process consistent with forming fins for these two types of FinFETs on a single wafer surface.

Both the silicon FinFET stack 410 and the silicon germanium FinFET stack 420 have a silicon substrate 411 at the bottom of the stack. Some stacks used to create a damage-resistant fin structure may be generated in a manufacturing facility, or may come to a manufacturer pre-made as SOI wafers, wherein a silicon substrate 411 is overlaid with, first, an insulator layer 412, and second, with a blanket silicon layer on top of the insulator layer 412. The cross-sectional views shown herein describe a first silicon region 413 found in the silicon FinFET stack 410, and a second silicon region 415 in the silicon germanium FinFET stack 420, respectively. The first silicon region 413 and the second silicon region 415 may be separated from each other by shallow trench isolation (STI) in order to further electrically insulate the transistor structures from neighboring circuit elements. In the cross-sectional view 400, a first blanket hardmask 402 has been deposited on top of the first silicon region 413, and a first silicon germanium layer 405A has been deposited on top of the second silicon region 415. According to embodiments, the concentration of germanium in the first silicon germanium layer 405A may be between 10% and 30% germanium.

Figure 5:
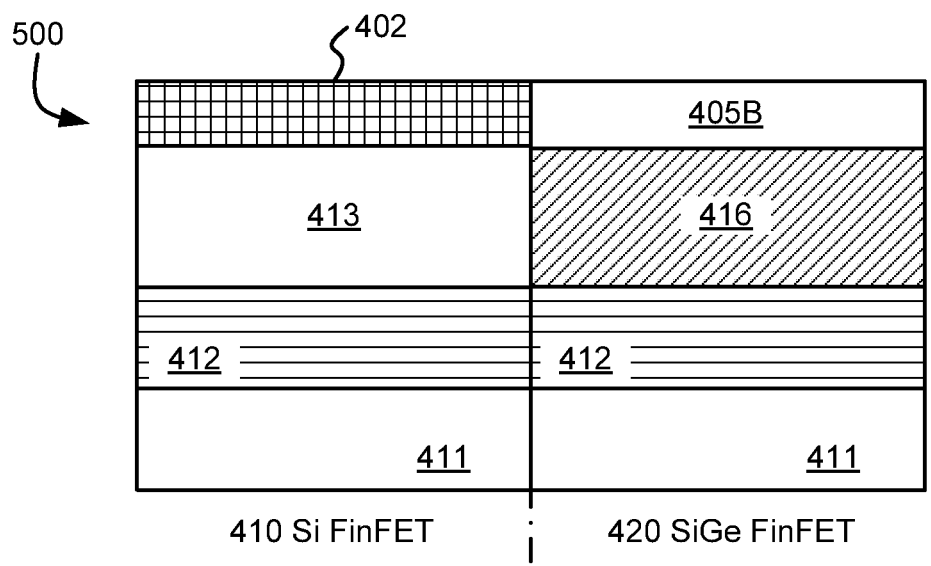
FIG. 5 shows a cross-sectional view of material stacks that can be made into a silicon FinFET and a silicon germanium FinFET, where germanium has been condensed into a silicon region from a sacrificial silicon germanium layer, according to embodiments.

FIG. 5 shows a cross-sectional view 500 of a silicon FinFET stack 410 and a silicon germanium FinFET stack 420. The silicon germanium FinFET stack has been altered by a condensing process, wherein germanium from a first silicon germanium layer 405A (see FIG. 4) has been diffused downward into the second silicon region 415 to form a second silicon germanium layer 416. During condensing, oxygen reacts with silicon in the first silicon germanium layer 405A, to form silicon dioxide. Process conditions can be adjusted such that, silicon dioxide forms preferentially over germanium oxide. Rather than form germanium oxide, the germanium atoms can diffuse downward as they are liberated from surrounding silicon atoms, enriching the second silicon germanium layer 416 more and more as the condensing process continues. The first blanket hardmask 402 on top of the first silicon region 413 serves as a protective barrier to prevent the condensing process from creating a silicon dioxide layer on top of the first silicon region 413.

According to embodiments, the amount of germanium diffusion into the second silicon region and the profile of germanium distribution within the second silicon germanium layer can be controlled by adjusting the temperature profile of the condensing process and the amount of oxygen that is passed over the wafer surface during the condensing process. For example, a first silicon germanium layer 405A may undergo a condensing process step to form silicon dioxide layer 405B as the germanium diffuses downward to form the second silicon germanium layer 416. The first silicon germanium layer 405A may, in some embodiments, contain between 10% and 30% germanium, according to embodiments, and the second silicon germanium film 416 may also contain between 10% and 30% germanium after the first silicon germanium layer 405A has been condensed.

Figure 6:
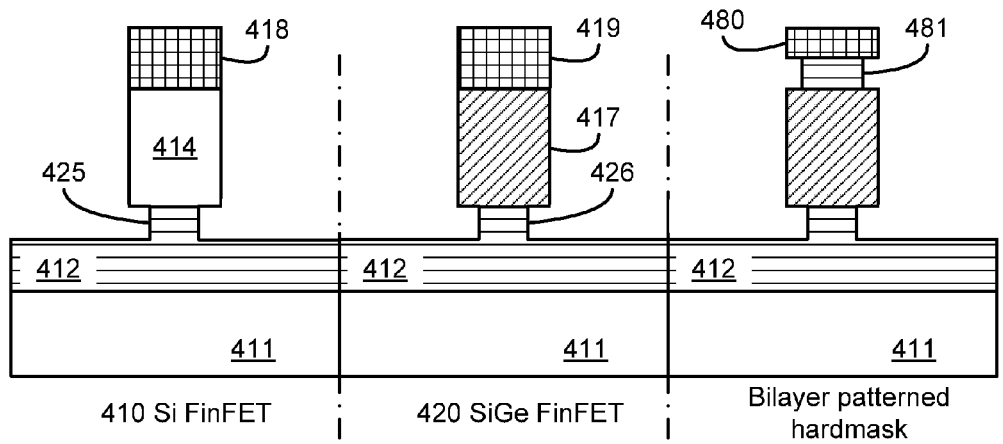
FIG. 6 shows a cross-sectional view of a silicon fin structure stack and a silicon germanium fin structure stack after recessing the insulator layer to form a footer beneath each fin structure, according to embodiments.

FIG. 6 shows a cross-sectional view 600 of three fin structures after recessing the insulator layer to form a footer beneath each fin structure, according to embodiments. The cross-sectional view 600 is consistent with embodiments of semiconductor wafers in which, first, the first blanket hardmask 402 and the first silicon dioxide layer 405B have been removed from the wafer surface. The removing of these films may have been accomplished by treatment with acidic solutions or by using a gaseous etch process, according to embodiments and process flows recognized by practitioners as being effective on such materials.

Second, consistent with embodiments of the present disclosure, a second blanket hardmask can be deposited on top of both the first silicon region 413 and the second silicon germanium layer 416 (formed after the condensing process described in FIG. 5), and the second blanket hardmask can be patterned with photoresist and etched in order to create hardmasks 418, 419 that will define the basic outlines of silicon fin structures and silicon germanium fin structures, respectively, on the wafer surface. In some embodiments, the depositing and patterning of a photoresist, followed by etching down to the insulator layer, may be accomplished independently for silicon fin structures and for silicon germanium fin structures. In some embodiments the second blanket hardmask can be made of a single material such as silicon nitride. Other embodiments may contain a bilayer hardmask with a bottom mask layer of silicon dioxide resting on top of the silicon or silicon germanium that will become the final fin of a FinFET. A top mask layer of, e.g., silicon nitride, may also be present. The silicon dioxide may be present in order to allow for endpoint detection capability when performing planarization (chemical mechanical polishing) of the wafer.

In embodiments where the patterning and etching of silicon fin structures or silicon germanium fin structures occurs independently, the depositing a second hardmask may occur at once on regions designated for both types of fin structures, and the patterning and etching of fin structures may occur in separate steps, where new layers of photoresist are deposited, patterned, and etched for each type of fin structure being created.

Once the silicon fin structures 414 and the silicon germanium fin structures 417 have been formed on the first top side of the insulator layer 412, the wafer surface may be processed, such as by using an acid such as dilute hydrofluoric acid, in order to perform a vertical recess and a horizontal recess of the insulator layer 412. The vertical recess process may create a second top side of the insulator layer 412 in an open area that is outside the perimeter of the fin structure (414 or 417, respectively). The horizontal recess process on the wafer surface may undercut the fin structure slightly, creating a first footer 425 beneath the silicon fin structure 414, and a second footer 426 beneath the silicon germanium fin structure 417. The first insulator top side may be preserved in the footer region, on top of the insulator layer 412 where the footer supports the base of the fin structures in the respective film stacks 410 and 420. In embodiments where a bilayer hardmask scheme is used to define a fin structure (such as when the inlay material will be silicon nitride), a silicon dioxide bottom mask layer 481 may be horizontally (laterally) recessed beneath a silicon nitride top mask layer 480 during the recessing of the insulator layer. The amount of remaining silicon dioxide in the bottom mask layer 481 may be tailored to provide enough material that using endpoint detection during subsequent planarization steps remains feasible.

Figure 7:
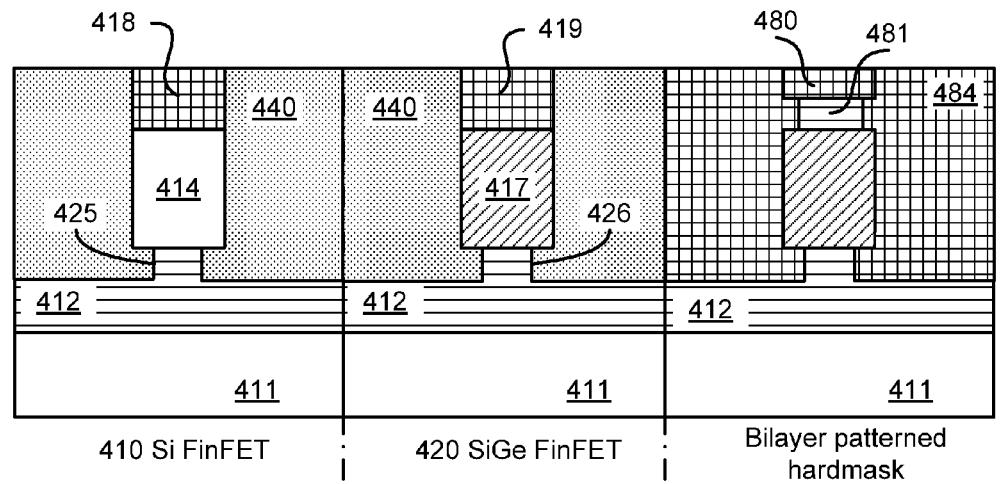
FIG. 7 shows a cross-sectional view of three types of fins/fin structures after inlay material has been deposited onto the insulator layer, according to embodiments.

FIG. 7 shows a cross-sectional view 700 of three types of fins/fin structures after inlay material has been deposited onto the second top side of the insulator layer 412, according to embodiments. The inlay material 440, 484, may be a metal oxide with a high dielectric constant (κ). Examples of such high-κ dielectric materials can include metal oxides where one or more metals are combined to form the oxide. Examples of such metals (and their oxides) can include hafnium, zirconium, lanthanum, aluminum, titanium, strontium, and yttrium, which can produce the metal oxides: $HfO_2$, $ZrO_2$, $La_2O_3$, $Al_2O_3$, $TiO_2$, $SrTiO_3$, $LaAlO_3$, and $Y_2O_3$. The inlay material 440, 484, may also be an oxynitride formed with one or more of the following metals: hafnium, zirconium, lanthanum, aluminum, titanium, strontium, and yttrium. Oxy-nitrides (represented by the chemical formula: $[metal(s)]O_xN_y$) can generally have a wide range of oxygen and nitrogen concentrations and can be made with a single metal or mixtures of metals. Examples of oxy-nitrides can include hafnium oxy-nitride, zirconium oxy-nitride, lanthanum oxy-nitride, titanium oxy-nitride, strontium titanium oxy-nitride, lanthanum aluminum oxy-nitride, and yttrium oxy-nitride. According to embodiments, different inlay materials may be appropriate on various types of fin structures according to integrated circuit manufacturing process flows to provide enhanced protection for the insulator layer to particular processing conditions (wet etch resistance, plasma etch/plasma damage resistance, etc.). As deposited, the inlay material 440, 484, may be on the second top side of the insulator layer 412 and make contact with each of the plurality of sides of the footer perimeter and also be in contact with the overhang area on a fin base.

The inlay material may be amorphous, a characteristic property of the deposition method (such as chemical vapor deposition (CVD) or plasma-enhanced chemical vapor deposition (PE-CVD)) used to form the inlay material layer. The inlay material can fill the undercut beneath a fin structure and isolate (or encapsulate) the insulator layer (both the footer and the second top side of the open area of the insulator layer outside the fin perimeter) from the space above the semiconductor wafer. The isolation or encapsulation of the insulator layer can prevent the insulator layer from undergoing chemical reactions during, or from experiencing damage caused by, subsequent process steps performed on the wafer during the integrated circuit manufacturing process.

In the cross-sectional view 700, the deposited inlay material has been planarized to expose the first patterned hardmask 418 on top of the first fin structure 414, and the second patterned hardmask 419 on top of the silicon germanium fin structure 417. The cross-sectional view 700 also shows that planarization inlay material 484 has proceeded to expose a top hardmask layer 480 that can be made of silicon nitride. The bottom hardmask layer 481 can be a different dielectric material such as silicon dioxide, which can provide endpoint capability during chemical mechanical polishing (CMP, or planarization) of the film stack during manufacturing to prevent over-polishing and damage to the fin structures.

When the hardmask and inlay material are chemically dissimilar (such as a silicon nitride hardmask and a hafnium dioxide inlay), removing the hardmask and recessing the inlay can occur in two discrete steps, where different etching chemicals are applied to the wafer surface in sequence in order to remove the two materials.

Figure 8:
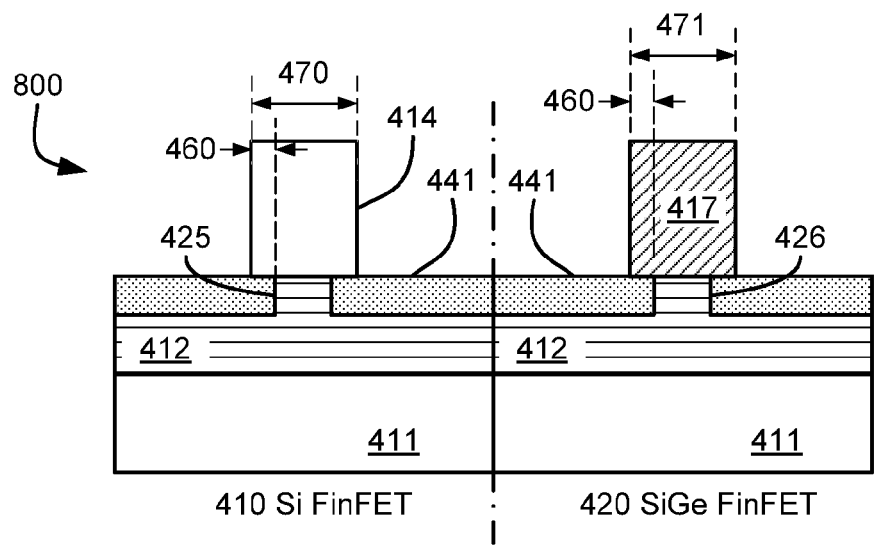
FIG. 8 shows cross-sectional view of two types of fin structures after removing the hardmasks and recessing the inlay material, according to embodiments.

FIG. 8 shows cross-sectional view 800 of two types of fin structures after removing the hardmasks and recessing the inlay material, according to embodiments. Each inlay segment 441 (adjacent to the FinFET) has an inlay thickness approximately equal to the footer height of the footer that it is in contact with. In the open areas beyond the perimeters of the silicon fin structure 414 or the silicon germanium fin structure 417, the inlay thickness may be greater or less than the footer height, according to embodiments, while not adversely affecting the ability of the inlay segment 441 near a fin structure to isolate the insulator layer 412 (and especially the footer 425 and 426) from subsequent wafer processing conditions.

Silicon fin structure 414 may have a first silicon fin width 470, measured along a cross-sectional line that runs perpendicular to silicon fin structure. There may be a first overhang width 460 between the side of a first footer 425 beneath the first silicon fin structure 414, and the side of the silicon fin structure. The first silicon fin width 470 may be equal to the footer width of the first footer 425 combined with the two first overhang widths 460 (one on each side of the footer 425).

Silicon germanium fin structure 417 may have a first silicon germanium fin width 471 that is equal to the width of the second footer 426 combined with the two first overhang widths 460, one on each side of the second footer 426 beneath the silicon germanium fin structure 417. Each inlay segment 441 may make contact with the base of an adjoining fin, the side of a footer, and second top side of the insulating layer 412.

Figure 9:
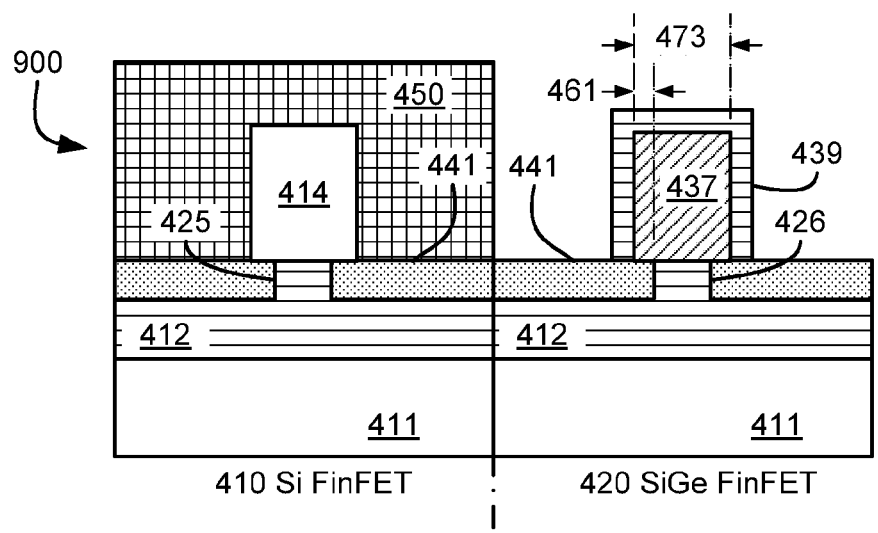
FIG. 9 shows cross-sectional views of a silicon germanium fin with a silicon dioxide cap layer on top of the silicon germanium fin, and of a silicon fin structure protected by a mask layer, according to embodiments.

FIG. 9 represents embodiments of a cross section 900 of fin structures on a semiconductor wafer after a silicon germanium fin structure 417 has been trimmed to form a first silicon dioxide cap layer 439 on top of the trimmed silicon germanium fin 437. A mask layer 450 may overlay a silicon fin structure 414 in order to protect the silicon fin structure from the trimming process.

A silicon germanium fin structure 417 may be trimmed at some point during the manufacturing process in order to adjust its final dimensions. Such dimensional adjustments may be desirable in order to finalize the profile of the fin structure and to tailor its electrical properties. In the case of silicon germanium fin structures, a trim process may also increase the germanium concentration of the final fin (and with the changing germanium concentration, also change the amount of strain present in the fin). A silicon germanium fin structure 417 may have a germanium concentration between ten percent and thirty percent before trimming, and the trimmed silicon germanium fin 437 may have a germanium concentration between thirty percent and one hundred percent, according to embodiments.

During trimming (or condensing), the silicon germanium fin structure 417 may be heated in an oxygen-containing atmosphere in order to form silicon dioxide on the surface of the silicon germanium fin structure. Varying the exposure time and the temperature profile during the trimming (condensing) process may change the formation rate and the penetration depth of a silicon dioxide cap layer into the silicon germanium fin structure, and can provide a degree of control over the final shape and the final concentration of germanium in the trimmed silicon germanium fin 437. In some embodiments, the silicon germanium fin 437 may have a silicon dioxide cap layer that has a thickness of at least four nanometers and no more than seven nanometers.

The trimmed silicon germanium fin 437 can have a second overhang width 461 that is smaller than the first overhang width 460 in the untrimmed silicon germanium fin structure 417. Because silicon is consumed (by becoming silicon dioxide) by the trimming/condensing process, the fin width 473 of the trimmed silicon germanium fin can be less than the width 471 of the untrimmed silicon germanium fin structure 417. In some embodiments, the silicon may be completely consumed, leaving a germanium fin (containing up to one hundred percent germanium) on the footer that is thinner than the original silicon germanium fin structure 417.

In some embodiments, the second overhang width 461 of the trimmed silicon germanium fin 437, measured between the second footer 426 perimeter and the perimeter of the trimmed silicon germanium fin 437, can be at least 2 nanometers on each side of the trimmed silicon germanium fin 437. Overhang widths greater than 2 nanometers or less than 2 nanometers may be created, but may have accompanying issues. When an overhang width is more than 25% of the fin width at the fin base, the footer may be so narrow that the risk of fin tipping or excessive undercut is elevated. Further, when an overhand width is less than 2 nanometers, it may not provide sufficient protection from subsequent processing steps for the insulator layer 412.

Figure 10:
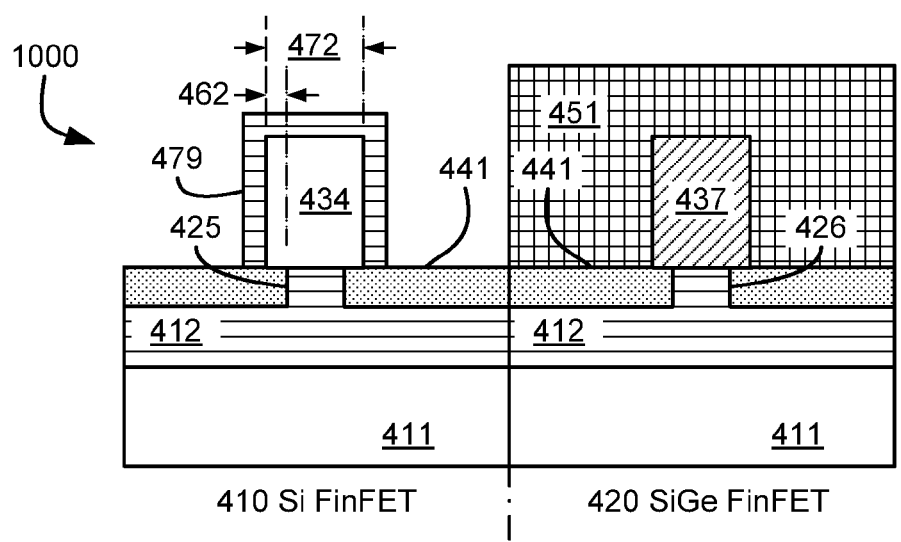
FIG. 10 shows a cross-sectional view of two fins on a semiconductor wafer, including a trimmed silicon fin with a silicon dioxide cap layer on it, after trimming, according to embodiments.

FIG. 10 shows a cross section 1000 of fins on a semiconductor wafer, where a silicon germanium fin 437 is covered by a mask layer 451 while a silicon fin structure 414 is trimmed. A mask layer 451 may be deposited on top of a trimmed silicon germanium fin 437 and on top of inlays 441 that adjoin the trimmed silicon germanium fin. The silicon fin 414 may be exposed to an oxygen-containing atmosphere at elevated temperatures in order to form a second silicon dioxide cap layer 479 on top of the trimmed silicon fin 434. The trimmed silicon fin may have a second fin width 472 that is less than the first fin width 470 measured at the same location prior to trimming. The trimmed silicon fin 434 may have a third overhang width 462 that is smaller than the first overhang width 460 and that is different than the second overhang width 461 measured on the trimmed silicon germanium fin 437. The overhangs on both sides of the trimmed silicon fin 434 may rest on the inlay 441 on either side of the fin in order to isolate the insulator layer 412 from subsequent wafer processing conditions to reduce damage such as tipping, and excessive undercut (leading to liftoff) by wafer processing conditions. While the process flows described herein showing silicon germanium fin trimming (and sometimes condensing) before the silicon fin trimming step, trimming may be performed in any order (silicon germanium fin structure trimming first or silicon fin structure trimming first) or only one type of fin structure being trimmed while the other type of fin/fin structure remains unmodified after being formed.

Figure 11:
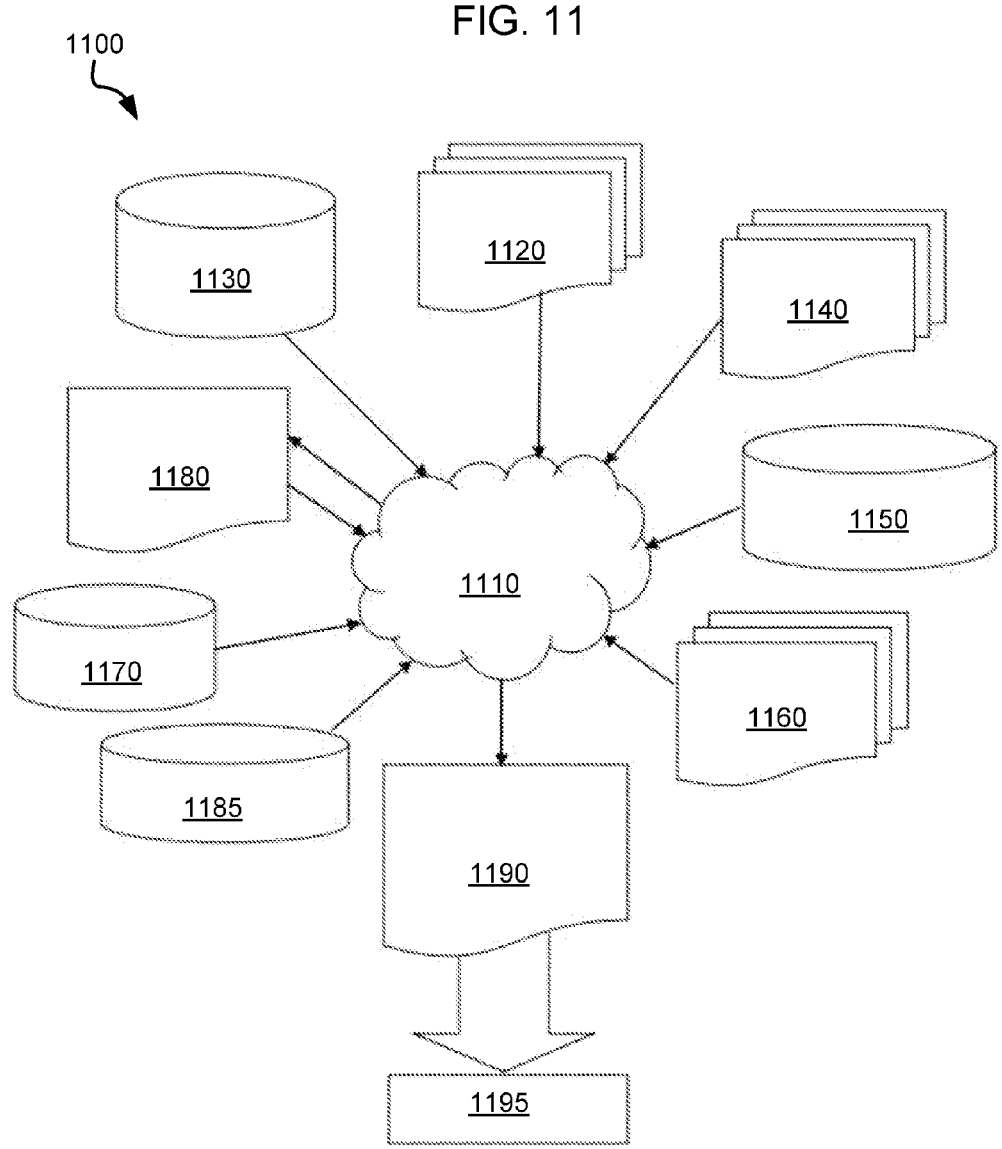
FIG. 11 is a flow diagram of a design process used in semiconductor design, manufacture, and/or test.

FIG. 11 shows a block diagram of an exemplary design flow 1100 used for example, in semiconductor IC logic design, simulation, test, layout, and manufacture. Design flow 1100 includes processes, machines and/or mechanisms for processing design structures or devices to generate logically or otherwise functionally equivalent representations of the design structures and/or devices described above and shown in FIGS. 1, 9, and 10. The design structures processed and/or generated by design flow 1100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1100 may vary depending on the type of representation being designed. For example, a design flow 1100 for building an application specific IC (ASIC) may differ from a design flow 1100 for designing a standard component or from a design flow 1100 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 1120 that is preferably processed by a design process 1110. Design structure 1120 may be a logical simulation design structure generated and processed by design process 1110 to produce a logically equivalent functional representation of a hardware device. Design structure 1120 may also or alternatively comprise data and/or program instructions that when processed by design process 1110, generate a functional representation of the physical structure of a hardware device. Whether representing functional and/or structural design features, design structure 1120 may be generated using electronic computer-aided design (ECAD) such as implemented by a core developer/designer. When encoded on a machine-readable data transmission, gate array, or storage medium, design structure 1120 may be accessed and processed by one or more hardware and/or software modules within design process 1110 to simulate or otherwise functionally represent an electronic component, circuit, electronic or logic module, apparatus, device, or system such as those shown in FIGS. 1, 9, and 10. As such, design structure 1120 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1110 preferably employs and incorporates hardware and/or software modules for synthesizing, translating, or otherwise processing a design/simulation functional equivalent of the components, circuits, devices, or logic structures shown in FIGS. 1, 9, and 10 to generate a Netlist 1180 which may contain design structures such as design structure 1120. Netlist 1180 may comprise, for example, compiled or otherwise processed data structures representing a list of wires, discrete components, logic gates, control circuits, I/O devices, models, etc. that describes the connections to other elements and circuits in an integrated circuit design. Netlist 1180 may be synthesized using an iterative process in which Netlist 1180 is resynthesized one or more times depending on design specifications and parameters for the device. As with other design structure types described herein, Netlist 1180 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1110 may include hardware and software modules for processing a variety of input data structure types including Netlist 1180. Such data structure types may reside, for example, within library elements 1130 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1140, characterization data 1150, verification data 1160, design rules 1170, and test data files 1185 which may include input test patterns, output test results, and other testing information. Design process 1110 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1110 without deviating from the scope and spirit of the invention. Design process 1110 may also include modules for performing standard circuit design processes such as timing analysis, verification, design rule checking, place and route operations, etc.

Design process 1110 employs and incorporates logic and physical design tools such as HDL compilers and simulation model build tools to process design structure 1120 together with some or all of the depicted supporting data structures along with any additional mechanical design or data (if applicable), to generate a second design structure 1190. Design structure 1190 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 1120, design structure 1190 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 9, and 10. In one embodiment, design structure 1190 may comprise a compiled, executable HDL simulation model that functionally simulates the devices shown in FIGS. 1, 9, and 10.

Design structure 1190 may also employ a data format used for the exchange of layout data of integrated circuits and/or symbolic data format (e.g. information stored in a GDSII (GDS2), GL1, OASIS, map files, or any other suitable format for storing such design data structures). Design structure 1190 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 9, and 10. Design structure 1190 may then proceed to a stage 1195 where, for example, design structure 1190: proceeds to tape-out, is released to manufacturing, is released to a mask house, is sent to another design house, is sent back to the customer, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A semiconductor structure, comprising:
    a fin having a fin perimeter, a fin base and fin sidewalls, the fin base having an overhang area, the fin sidewalls being exposed;
    an insulator layer having an open area and a footer, the footer having a first top side, a footer height, and a footer perimeter with a plurality of footer perimeter sides, the footer perimeter being within the fin perimeter, the fin base resting on the first top side with the overhang area being on the fin base between the fin perimeter and the footer perimeter, the open area having a second top side outside the footer perimeter; and
    an inlay that is etch-resistant and electrically non-conductive, the inlay having an inlay thickness equal to the footer height, the inlay resting on the second top side and being in contact with the overhang area and each of the plurality of footer perimeter sides, the inlay being annealed.

2. The semiconductor structure of claim 1, wherein the etch-resistant inlay includes an inlay material selected from a group consisting of a silicate, a metal oxide, and an oxy-nitride.

3. The semiconductor structure of claim 2 wherein the etch-resistant inlay includes a metal oxide with at least one metal selected from a group consisting of hafnium, zirconium, lanthanum, aluminum, titanium, strontium, and yttrium.

4. The semiconductor structure of claim 2, wherein the etch-resistant inlay is made of an oxy-nitride including at least one metal selected from a group consisting of hafnium, zirconium, lanthanum, titanium, strontium, and yttrium.

5. The semiconductor structure of claim 2, wherein the etch-resistant inlay is made of a silicate including at least one metal selected from a group consisting of hafnium, zirconium, lanthanum, titanium, strontium, and yttrium.

6. The semiconductor structure of claim 1, wherein the overhang area is at least two nanometers wide between the fin perimeter and the footer perimeter.

7. The semiconductor structure of claim 1, wherein the footer has a footer width of at least three nanometers.

8. The semiconductor structure of claim 1, wherein the footer height is at least four nanometers.

9. A design structure readable by a machine used in design, manufacture, or simulation of an integrated circuit, the design structure comprising:
    a fin having a fin perimeter, a fin base and fin sidewalls, the fin base having an overhang area, the fin sidewalls being exposed;
    an insulator layer having an open area and a footer, the footer having a first top side, a footer height, and a footer perimeter with a plurality of footer perimeter sides, the footer perimeter being within the fin perimeter, the fin base resting on the first top side with the overhang area being on the fin base between the fin perimeter and the footer perimeter, the open area having a second top side outside the footer perimeter; and
    an inlay that is etch-resistant and electrically non-conductive, the inlay having an inlay thickness equal to the footer height, the inlay resting on the second top side and being in contact with the overhang area and each of the plurality of footer perimeter sides, the inlay being annealed.

* * * * *